_United States Patent_ [19]

Hugle et al.

[11] Patent Number: 5,517,279

[45] Date of Patent: May 14, 1996

[54] LENS ARRAY PHOTOLITHOGRAPHY

[76] Inventors: William B. Hugle, Casa Corallo 2/9, Costa di Dentro, CH-6614 Brissago; René Dändliker; Hans P. Herzig, both of Rue Breguet 2, CH-2000 Neuchâtel, all of Switzerland

[21] Appl. No.: 114,732

[22] Filed: Aug. 30, 1993

[51] Int. Cl.[6] ............................................. G03B 27/44
[52] U.S. Cl. ........................................ 355/46; 355/77
[58] Field of Search ................................. 355/1, 46, 50, 355/77

[56] References Cited

U.S. PATENT DOCUMENTS

| | | | |
|---|---|---|---|
| 3,584,950 | 6/1971 | Gundlach | 355/50 |
| 3,605,593 | 9/1971 | Anderson | 355/46 |
| 4,474,459 | 10/1984 | Tokumaru | 355/46 |
| 4,668,080 | 5/1987 | Gale et al. | 355/51 |

_Primary Examiner_—Richard A. Wintercorn

[57] ABSTRACT

Microlithography techniques have provided a means for the development of many useful devices from microcircuits, which made the computer era possible, to micromechanical devices such as motors that are only a few tens of microns across. A new use of a microdevice is presented here which serves to "payback" the art of microlithography as it is a significant contribution thereto. The device of the invention is a unique microdevice made with advanced microlithography techniques which when completed can be used as a new exposure tool for microlithography.

A lens array can be as thin as 1/40 of the thickness of the page that this text is printed on, yet have thereon an arrangement of optical lenses powerful enough to replace very sophisticated and bulky, million dollar precision optics.

An array of lenses can be fabricated with binary optical device and other techniques. The array having unlimited area and field of regard can be used as an exposure tool for very large area microdevices such as flat panel displays without the requirement of step and repeat operations which severely limit the throughput and yield in modern manufacturing methods.

14 Claims, 13 Drawing Sheets

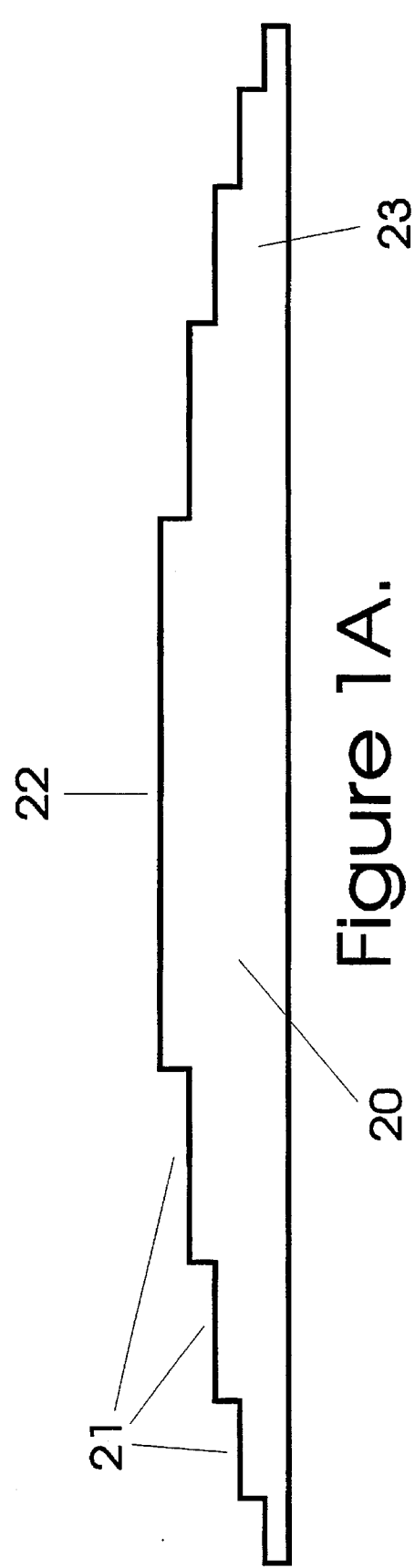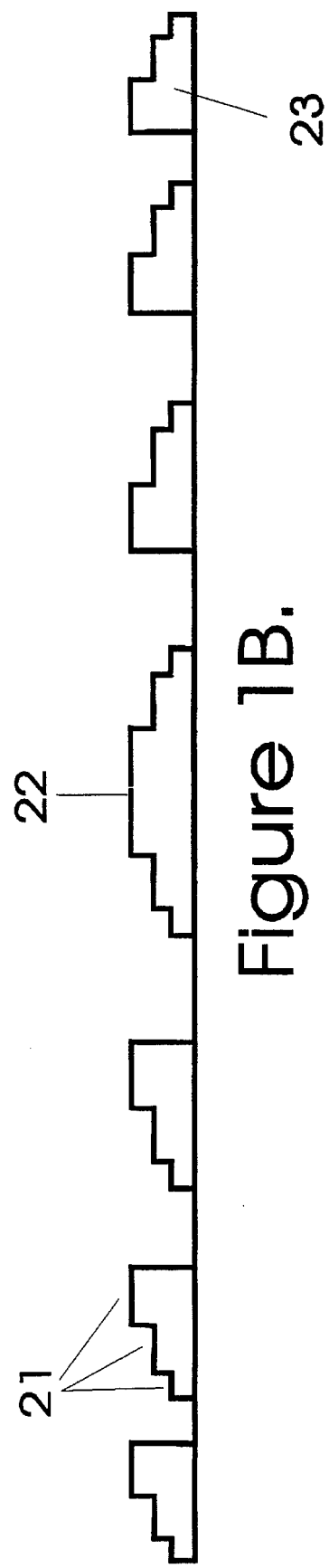

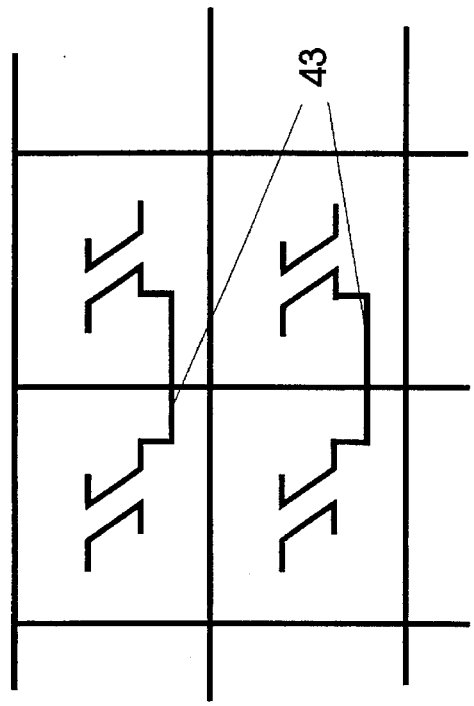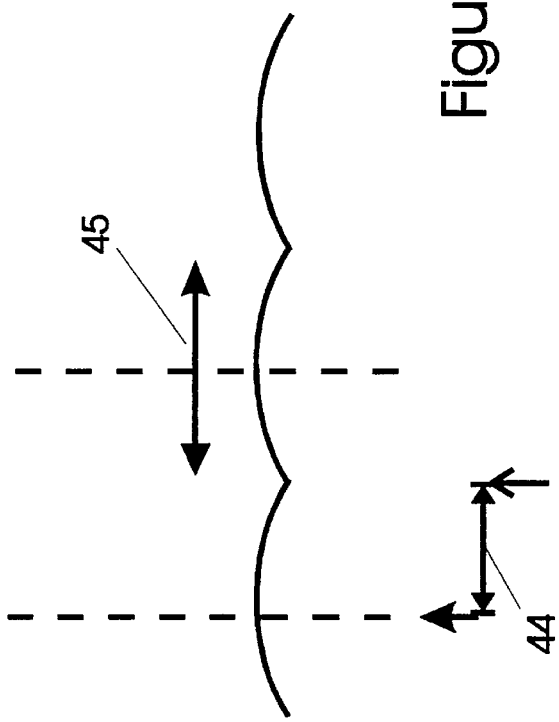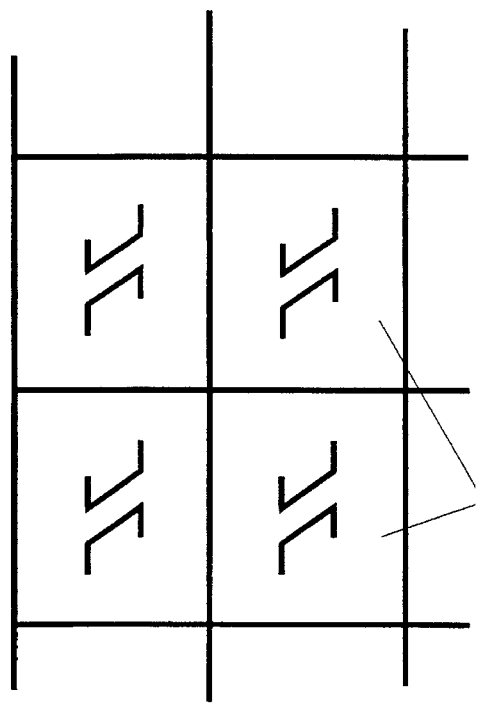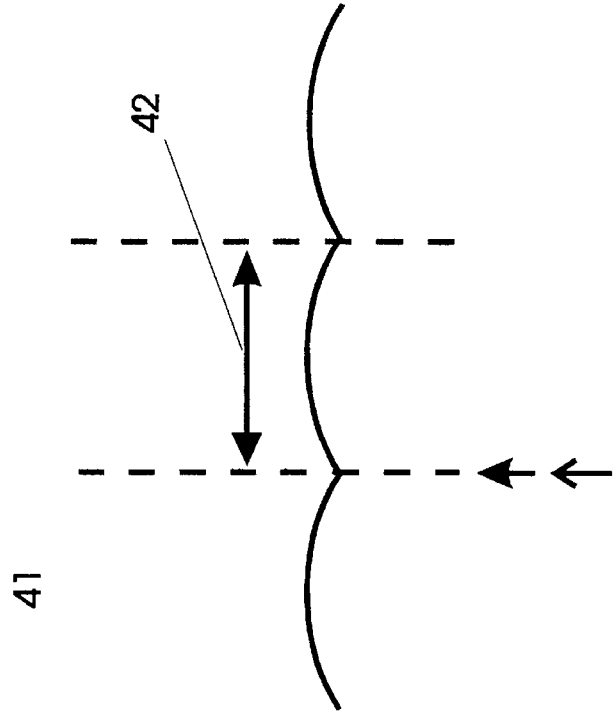
Figure 7

LENS ARRAY PHOTOLITHOGRAPHY

BACKGROUND OF THE INVENTION

This invention is concerned generally with microimaging and concerned specifically with photolithography using lens arrays.

Microlithography has a long history and has provided benefits to many fields. Those familiar with the very tedius and time consuming "wire-wrap" methods can fully appreciate the power of printed circuit technologies. It has now become possible using microlithography methods, to create several million transistors in an area smaller than a square centimeter. Mechanical devices also have enjoyed spectacular advances. It was recently reported in the Journal of Micromechanical Devices that a fully operational motor that is only tens of microns in width can be made using techniques of microlithography. These advances have made the visions depicted in the fictional movie "Innerspace" where microrobotic machines were injected into humans to perform operations on a microscopic level, into something less of a dream and infinitely closer to a reality. And finally, as will become evident in this disclosure, the advanced methods of microlithography have now been discovered to provide contributions to further advanced methods of microlithography. Projection of microimages is common for the manufacturing processes of microdevices including both electric and mechanical microdevices. These include, but are not limited to: electronic type devices such as micro integrated circuits and flat panel display devices, and physical devices such as surface acoustic wave devices, micromotors and other micromechanical devices.

Modern microlithography processes sometimes require projection of light images (photolithography) having features as small as, or even smaller than one micrometer. Images for microlithography applications having such small features are generally produced with large lenses in photolithography projection machines. It is a necessary result of physics that the smaller the features of an image, the larger is the lens necessary to faithfully reproduce those small features. Many problems such as lens abberations, thermal stability, limited fields-of-view, extremely large optic elements, uniformity, etc., are encountered when large lenses are designed for photolithography applications. Yet, design demands on lenses for photolithography have been increasingly difficult to realize as state-of-the-art advances in the microdevice sciences have pushed for higher lens performance.

A popular exposure tool for projecting images for photolithographic applications is called a "stepper machine". A stepper machine generally has a very precise large lens with a high numeric aperture. Some stepper machines are capable of faithfully reproducing images with features as small as 0.5 microns. Abberations, limit the useful field-of-view of stepper machines to a circular area of a few centimeters in diameter. Many devices, although being comprised of very tiny elements, necessarily extend over several centimeters in their entirety. For example, a Flat Panel Display (FPD) device may be fifty centimeters on a side being made up of millions of individual pixels that are only fifty microns on a side. To manufacture devices that require images larger than the maximum field size of the stepper machine, several stepper image fields are projected in sequential exposures immediately next to each other. This method requires a displacement of the lens with respect to the device substrate that is being printed, and therefore requires some very sophisticated motion and alignment equipment. The exposure steps and move steps are repeated until the entire surface of device substrate is exposed. In this way, a large area device can be "built-up" with a multiplicity of exposures of a single, area-limited stepper field.

It is very difficult to align two stepper fields together. The alignment accuracy is sometimes required to be a small fraction of the image feature size; as small as 100 nanometers. Even with perfect alignment, adjacent images do not always "communicate" well with each other. This is mainly due to third order aberrations such as "pincushion" distortion. Pincushion distortion gets worse as a function of the cube of the radius of an image point as measured from the lens axis in the image plane. These aberrations occur over the entire field area as geometric image placement errors which further complicate alignment of one field to an adjacent field. Because the field size of a stepper exposure machine is limited, and the alignment of one field to an adjacent field is extremely difficult, it necessarily takes a long time for devices requiring a large area exposures to be built-up from a multiplicity of smaller sub-fields. The time that it takes to perform the process limits the amount of devices that a given machine can produce. This limit is expressed as system "throughput" and a primary disadvantage of stepper machines is their low throughput. It is a further problem in the manufacture of flat panel displays to realize high yield. Sometimes during the manufacture of devices flaws occur that can have a catastophic effect on the performance of the device. A single error caused by field misalignment, which is common in stepping methods, can cause an entire device to be useless. Nevertheless, the "step-and-repeat" method has been the preferred method of microlithography to date for even large devices like FPDs. The use of stepper machines has resulted in unacceptably low throughput and yield problems. Production on a mass scale can only be economical with an exposure technique that can improve both the throughput and the yield that are currently known in the step-and-repeat methods.

Other methods of photolithography have been attempted that address the limited throughput and yield problems. A well known method of photolithography for very large areas is called "contact printing". Contact printing does not suffer from field size limitations, but has very bad contamination problems. It is a problem to replace expensive large area photomasks which need to be replaced frequently due to damage caused by contact. Contact printing therefore is not currently considered a feasible alternative. Still another method of large area exposure devices includes holographic photomasks which do not require lenses to form images. Holographic methods usually combine a photomask and an imaging means into a single device. These methods are quite elaborate and have yet to mature to the stage where production manufacturing is practical. Canon corporation offers lens imaging with scanning in one dimension and stepping in an orthogonal direction. A device produced by MRS Technology, Inc. called a Panel Printer™, is a photolithography device which specifically built for very large area photolithography. The device of MRS Technology, Inc. called a "stitching aligner". Although it is an advanced type of stepper, it also suffers from "stitching" type alignment errors. A device developed by Ultratech stepper company employs a mirror for reflective type imaging optics and is quite successful in producing some special advantages such as ultra high resolution. However their Markel-Dyson imager is not suited for large areas. All of the photolithography systems mentioned are deficient in their ability to achieve large field, efficient imagers. They can not accomplish the advantages of the current invention and they are not effective replacements thereof.

A unique optical device with special imaging properties is known as a lens array. Until now, applications were limited to fly's-eye, highly parallel type images having very limited applications. A lens array is an arrangement of a plurality of lenses adjacent to each other in a plane with each of their optical axis perpendicular thereto. Although it is possible to arrange conventional lenses in this manner, certain advantages are realized when the lenses are very small in size sometimes called "microlens arrays". There are several techniques used to create a microlens array, and advances in microfabrication techniques have recently provided very spectacular results. For example, some diffractive type devices are made by: 1) Lincoln Laboratory (MIT) produced by reactive ion etching, having numeric apertures from 0.25 to 0.5 are described in a paper published by Leger, Scott, and Veldkamp, in Applied Physics Letters, vol 52 pages 1771–1773 in the year of 1988; 2) OMRON, Japan: diffractive microlens produced by electron-beam lithography, NA=0.25 published by Aoyama, Horie, Yamashita, "Micro Fresnel lens fabricated by electron beam lithography" in SPIE proceedings 1211, 175–183 (1992). Refractive type microlens arrays are known and are simple to fabricate and the following are examples thereof: 1) NSG America inc. 2-d microlens array produced by photolithography and ion-exchange having a numeric aperture of 0.37. 2) CORNING shperical microlens arrays produced directly from glass by a photolytic process, NA<0.35 published in Applied Optics. vol 27, 476–479 1988. and 3) NPL National Physical Laboratory UK, microlens arrays produced by melting small photoresist islands NA<0.5, lenses range in diameter from 5 microns to 500 microns. Diffractive optical elements are sometimes called "binary optical devices" BODs. Binary optical devices can be designed with optical properties that could not be obtained with conventional refractive type spherical optics. For example, it is easy to approximate a lens of parabolic shape having little or no geometric aberrations found in spherical devices. BODs are known by experts to be used for optical interconnects, aberration correction, computer vision, optical multiplexers, and even microsurgery of the human eye. Uses of BODs in array arrangements are described in a paper published in *Scientific America* by Veldkamp and McHugh, two of the pioneers of binary optics. However, previous to the present disclosure, it was not anticipated that BODs could be used to make even better microlithography tools. It is now possible to provide superior photolithography exposure tools which use techniques of lens array optical imaging.

SUMMARY OF THE INVENTION

Comes now, an invention including novel methods of and devices for photolithography exposure to relieve problems heretofore not solvable by methods and devices known in the art.

It has been discovered that an array of microlenses can be used as a photolithography exposure tool to project image information of a photomask onto an image field of very large area. Many microdevices have a repetitive and discrete nature with respect to some unit element. For example, each pixel of a multi-million pixel flat panel display may be identical in circuit geometry. The repetitive and discrete nature of microdevices lends itself well to the imaging properties particular to lens arrays. Each lens of the array can be made to correspond to some unitary element of a particular microdevice. Even in the case where interconnects between unitary elements are required, the lens array can serve well. If the repetitive and discrete nature of microdevices is well matched with the repetitive and discrete properties of a lens array, the image field demarcations can be strategically placed to have minimal or no effect on a finished device. When designing devices to be manufactured by lens array photolithography, an important design step is to define a "unitary element". Using lens arrays for photolithography applications may imply design rules that are unique to array photolithography, but the new rules will be a small price to pay for the advantages returned. It is also possible that those new rules will yield new design advantages. A unitary element of a photomask pattern is some sub-area that is repeated over the entire device. For a lens array a unitary element can be defined by the image field limits of a single lens thereof. Lens arrays can be designed to have different cell size, shapes and configurations to match the geometries of various devices. Depending upon the discretization and repetitivity of a particular device, the unit cell characteristics of a lens array would be designed to accommodate the geometry features of that particular device. Dividing the image of a microdevice into subsections that can be imaged simultaneously is new to the art.

Since an array can be comprised of a plurality of microlenses in a planar arrangement, arrays provide for a large area imaging. It is now possible to make a single exposure over a comparatively large area, thereby eliminating step-and-repeat operations and thereby reducing required exposure times for large area devices. As a further benefit, a lens array exposure tool can be constructed to be free from aberration errors associated with spherical optics thereby eliminating stitching error alignment problems which contribute to very low manufacturing yield. Thus methods of the invention are expected to improve throughput and manufacturing yield; the most serious limitations of large area microdevice manufacture. In addition, lens arrays can be adapted to address substrate shrinkage problems suffered by current microlithography systems. Although an obvious case against using arrays could be made by suggesting that each unit lens of the array also has a limited image field, the detailed disclosure that follows describes methodologies that recognizes this specific limitation and provides clever solutions for it. Indeed it is a formidable task to have a continuous image over a large area using lens arrays; the following disclosure directly addresses this issue.

It is therefore a primary object of the invention to provide an apparatus for photolithography exposure. It is also a primary object of the invention to provide a method of photolithography. It is an object of the invention to provide unique ways of communication between adjacent fields of a lens array of subfield images. It is a further object to provide an imaging system with a multiplicity of lens arrays. It is a still further object to provide a photolithography system based on binary optical devices. It is a further object of the invention to provide a photolithogrraphy imaging system free from geometrical image errors. It is a further object of the invention to provide a photolithography imaging system with very large area, fast exposure, and high image accuracy and fidelity.

A better understanding can be had with reference to the detailed description of preferred embodiments and with reference to the appended drawings. These embodiments represent particular ways to realize the invention and are not inclusive of all ways possible to benefit from the invention. Therefore, there may exist embodiments that do not deviate from the scope of this disclosure as set forth by the claims, but do not appear here as specific examples.

BRIEF DESCRIPTION OF THE DRAWINGS

The features mentioned in the summary of the invention and other features, aspects, and advantages of the present invention will become better understood with regard to the following description, appended claims and drawings where:

FIG. one A and B are a representation of how a multilayer binary optical device can be used to represent a lens;

FIG. two A, B and C shows three alternative arrangements of lens elements in an array;

FIG. three is an optical schematic drawing that shows simple imaging of a photomask of multiple images onto an image field through an array of lenses in a lens array plane;

FIG. four shows that image inversion properties occur within each lens cell;

FIG. five A, B and C shows an array image comparison with an image from a conventional lens image;

FIG. six is an exploded view of an example of a particular flat panel display device, an AMLCD, that can be manufactured with methods and devices of the invention;

FIG. seven shows possible steps between images and the communication possible between pixels provided by field shifted layers;

FIG. eight shows a magnification schematic, it is possible to achieve reduction (magnification<1) but this is not shown.

FIG. nine A and B shows field overlap that can be used to facilitate interconnections between adjacent image fields;

FIG. ten A and B show how four adjacent field images can be made to form a simple continuous image;

FIG. eleven A and B shows a complex image that is continuous over a multiplicity of cells and the mask that is required to generate such image;

FIG. twelve shows the use of a "field lens" to aperture single mask fields;

FIG. thirteen A, B and C shows the conformal mapping that is possible with binary optics "lenses".

PREFERRED EMBODIMENTS OF THE INVENTION

In accordance with each of the preferred embodiments of the invention, there is provided an apparatus for and method of photolithographic exposure. It will be appreciated that each of the embodiments described include both an apparatus and method and that the apparatus and method of one preferred embodiment may be different than the apparatus and method of another embodiment.

A machine for photolithography typically includes substrate handling systems, alignment mechanisms, a light source, an imaging means and a photomask. Some systems of the art will be useful for the photolithography machine of the invention, however some will be very different. In particular, the imaging means and the photomask or "reticle" as it is sometimes called, will both be different.

Figure 2A:
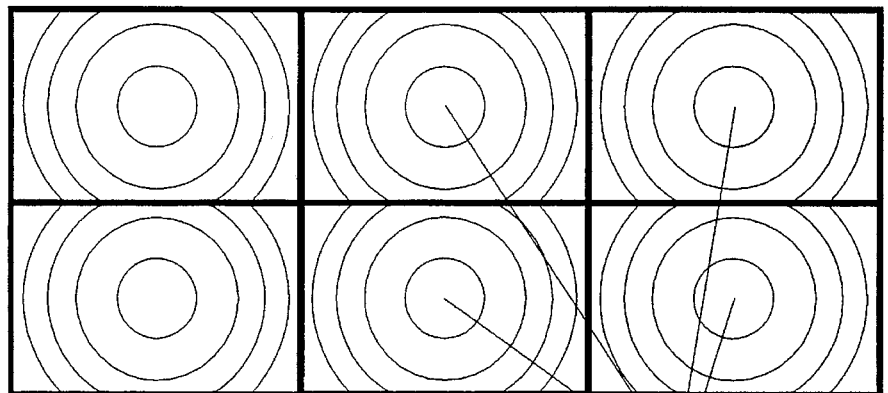
Figure 2B:
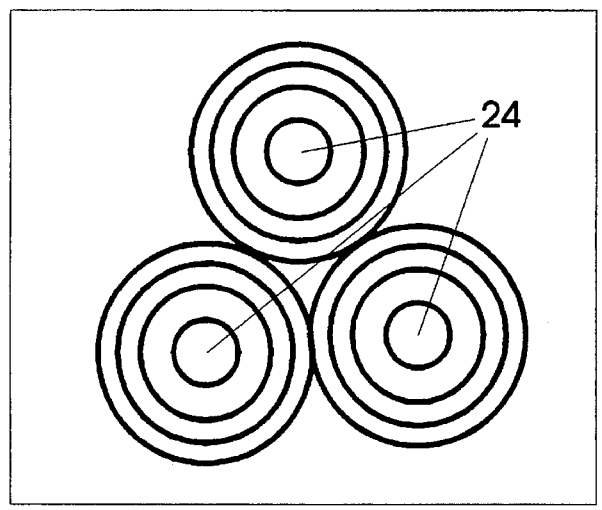
Figure 2C:
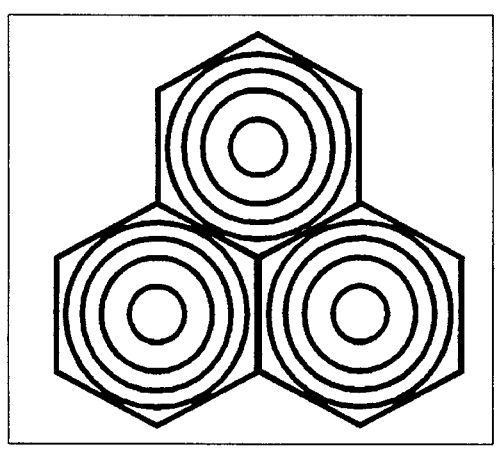

The imaging means of the invention, an array of lenses, has many imaging properties unique to arrays and very useful for photolithography applications. A plurality of lenses arranged in a two dimensional array can be realized by dividing a single large substrate into many subsections, each subsection thereby defining unitary lens areas. Into each unit lens area, a lens can be constructed using known techniques. For example, it is possible to create gradient index GRIN type lens by arrangement of the index of refraction profile of the substrate material between a first surface of the substrate and a second surface thereof. Alternatively, it is possible to heat a substrate with a previously preparred surface such that the surface tension of each unit lens areas forms a spherical surface therein. Methods of binary optical device BOD physics provide added advantages that are expected to provide favorable results for photolithography techniques and it is currently anticipated that BODs 20 will be a preferred method to fabricate lens arrays. BODs have been used: as imagers without sphereical abberrations, in combination with refractive type optics to correct chromatic abberation, and as optical elements with complex mapping properties. BODs work on principles of diffraction in comparison to conventional optics which rely on refraction to bend rays. A BOD can be made to by creating multi-level, or "staircase" 21 structure using common etching techniques. A diffractive lens similar to a Fresnel zone plate is effective for creating images similar to refractive optics. With only 16 staircase levels, a BOD can be up to 99 percent efficient at redirecting light in a desired direction. A BOD with 16 levels only requires 4 exposure and etching processes; an easy task for common lithography systems. The drawing FIG. 1 shows a BOD lens that has been etched into some bulk material. A circular blank is etched with a series of concentric staircase patterns. Each staircase proceeding out from the center 22 is made successively steeper and closer to its neighbor. The steeper staircases bend the light by ever increasing angles so that light passing through the edges of the lens 23 is focused to the same part as light passing through the center. It should be noted that at least three methods of forming lens arrays are well known in the art and that the details of array manufacture are left for other presentations. An array of lenses can be embodied in several ways to meet various repetive properties. The three drawings of FIG. two show how the lenses can be put on centers 24 and 25 that define triangular FIG. 2B, square, or rectangular FIG. 2A repetitive nature. Many other FIG. 2C possibilities can be easily used to support various design rules.

A photomask, sometimes called a reticle, is generally a light mask with aperture stops and apertures that serves to convert a uniform light field of some source to a spatially patterned light field. Typically a photomask is a substantially flat glass substrate with a pattern of chromium having been evaporated thereon. The pattern of the chromium defines the circuitry or other structure to be transmitted to the circuit substrate in a photolithographic process. A very specialized mask technology has stops and apertures where the apertures are of varying types. The phase of a light field wavefront passing through some apertures is shifted usually by a high index transparent material. "Phase shift" masks will work very well with the lens array technology and lens array system is expected to benefit from phase shift mask technologies.

Figure 3:
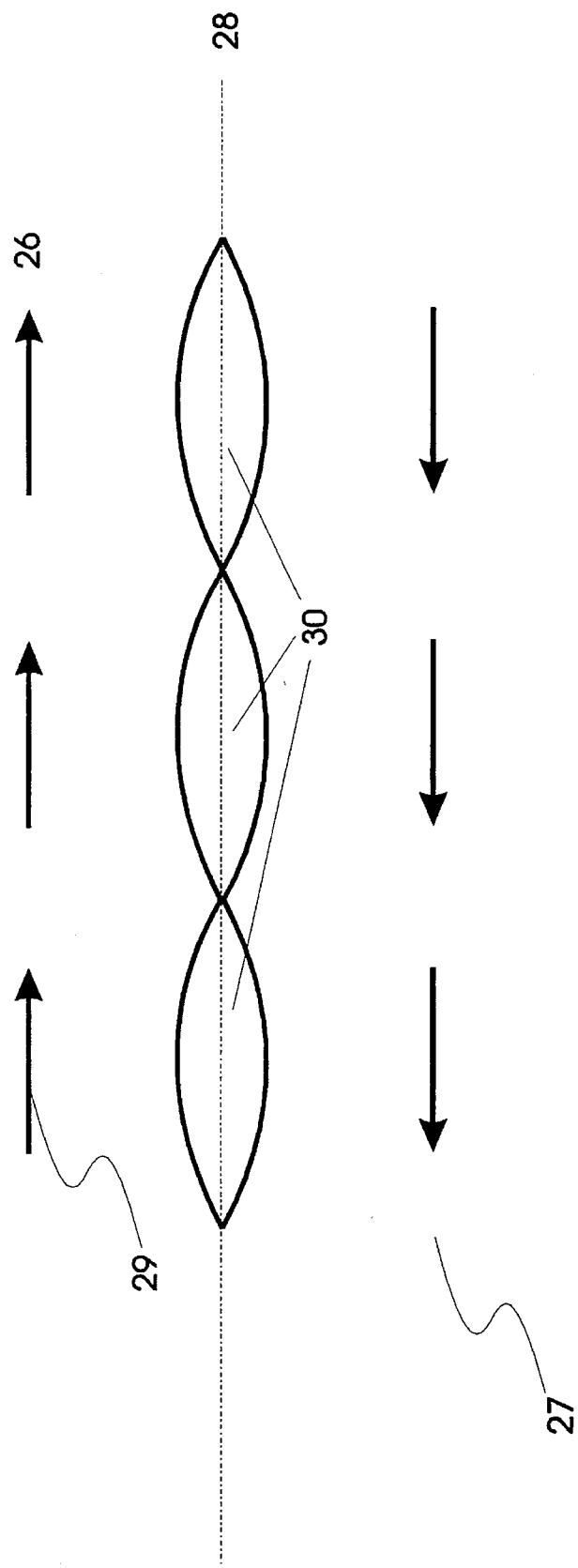
Figure 4:
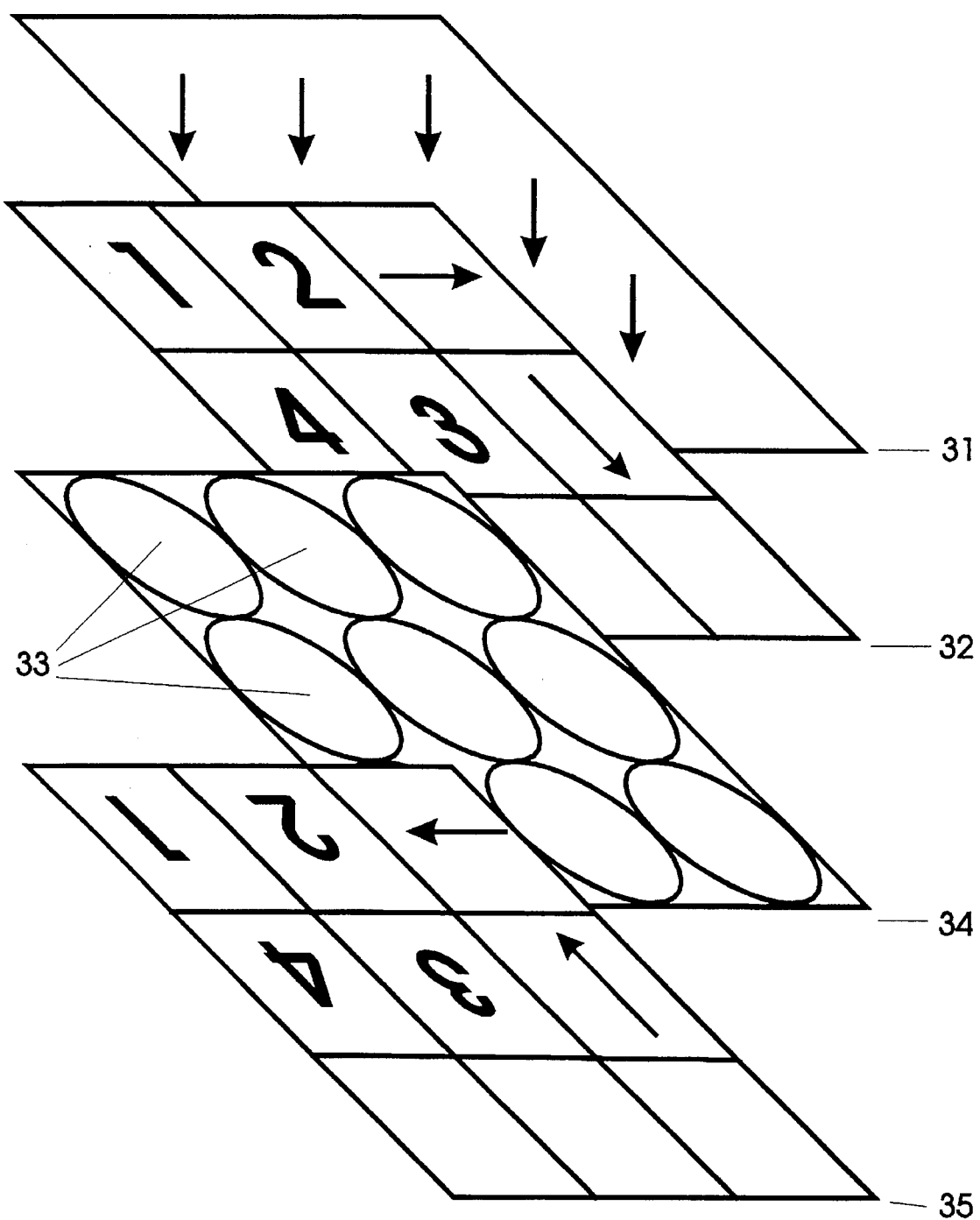
Figure 5A:
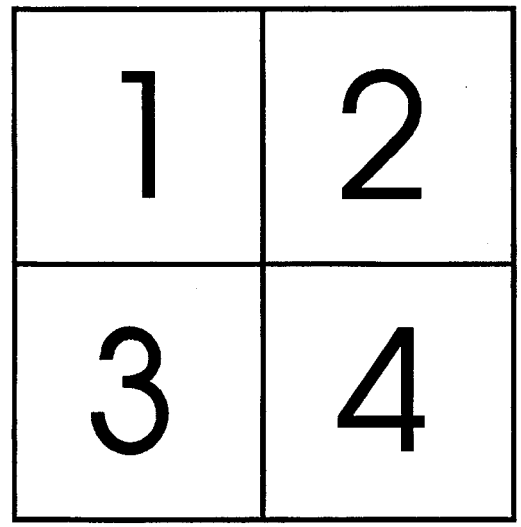
Figure 5B:
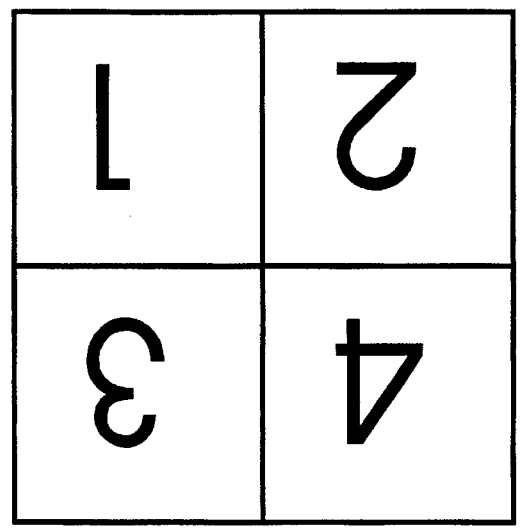
Figure 5C:
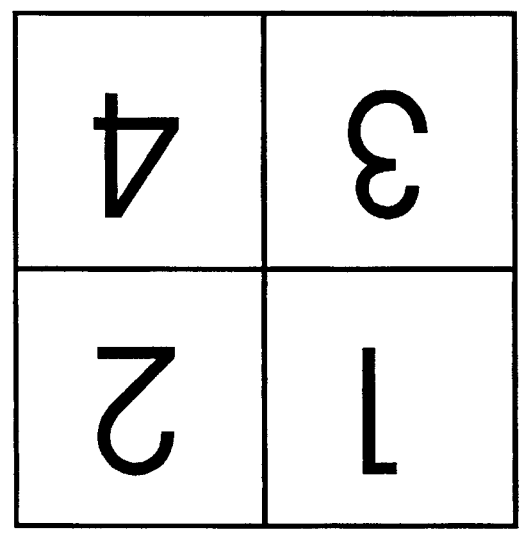
Figure 6:
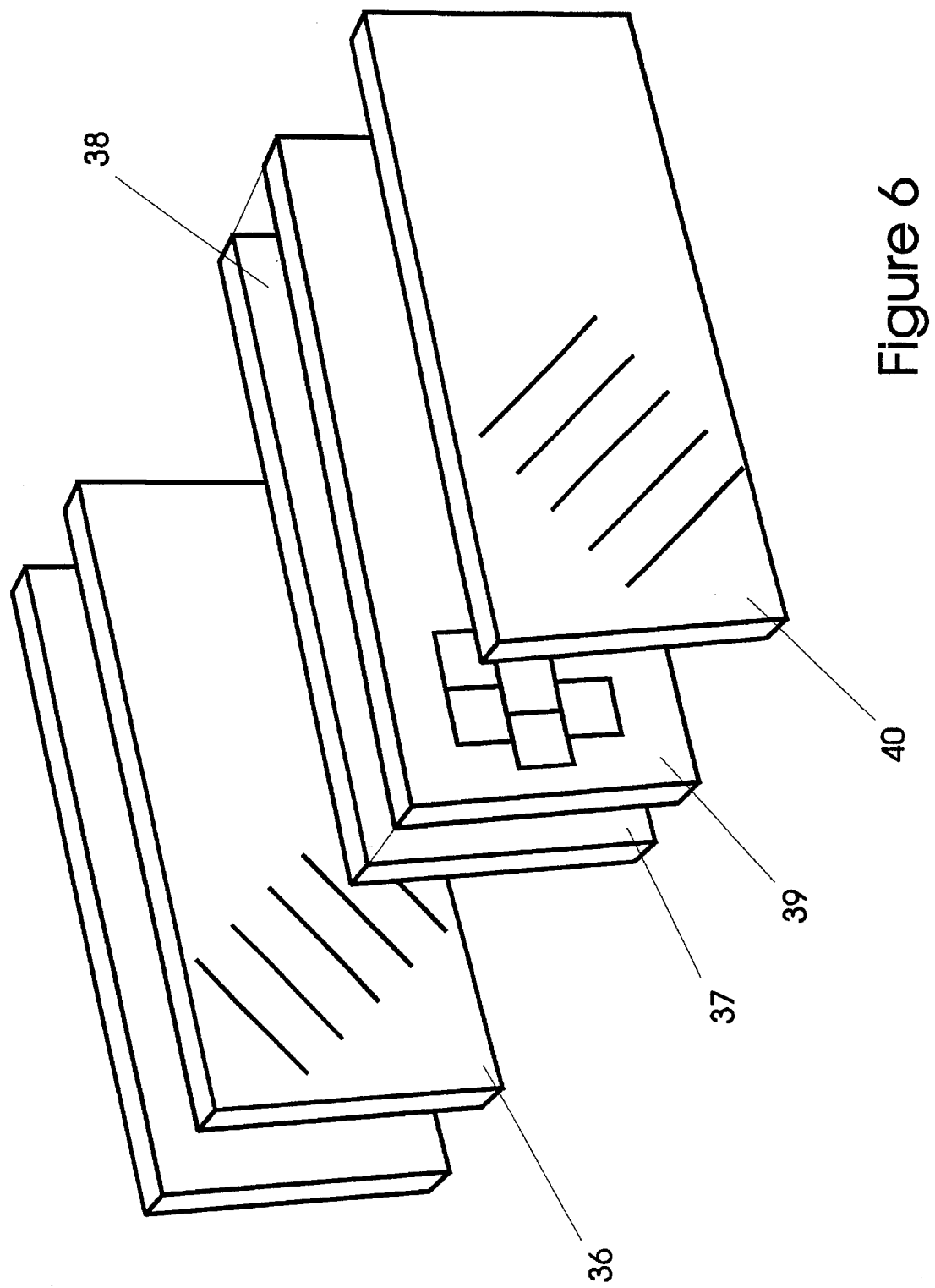

The spacing of the lens array with respect to the object (photomask pattern) 26 and image 27 (at the substrate surface) can follow the same rules of imaging with conventional single lenses whereby the size of the image is the same as the size of the photomask pattern when the lens plane 28 is placed between and equidistant from the object and image. An example of one to one imaging is shown in drawing FIG. 3. It is important to note that there is an image 29 inversion symmetric about the optical axis of each lens 30 of the array and the pattern of the photomask will necessarily be required to account for this image inversion. The pattern on a photomask of the art is therefore likely to be different than the pattern on a photomask of the invention and photomasks to be used with lens arrays may have a new set of corresponding design rules.

As a first simple preferred embodiment, an apparatus for photolithographic exposure which comprises a lens array, is provided. The apparatus for imaging a photomask pattern onto a substrate comprises a plurality of lenses arranged in a two dimensional array.

It is a further provision of this embodiment to realize a method of photolithographic exposure whereby a light field is passed through an array of optical elements to form at least one image. By directing a uniform plane wave light field 31 generated at a light source far from the photomask 32 or its optical equivalent, the aperture stops and passes of the photomask 32 modulate the light field to include the pattern information. The light field with the pattern information impressed thereon passes through the lensing mechanisms 33 of the array 34 and an image forms on the photoresist layer 35 thereby exposing it in a spatially modulated fashion. To make a very complete illustration of the best mode of the invention, the specific microdevice known as an Active Matrix Liquid Display (AMLCD) which is a specific type of flat panel display (FPD) will be presented as an example. It will be further appreciated that this device is one example of many possible FPDs and of many possible microdevices that can benefit from the various features, aspects and advantages of the invention. It is not intended that the use of the invention be limited to this specific device; and the contrary is explicitly stated here: the invention will be useful for all photolithography applications which yield various microdevices having properties that are compatible with the imaging characteristics of lens array devices.

The invention is particularly useful for the production of active matrix liquid crystal displays which is a type of high performance, high information density display. The invention can image active circuit patterns, which is a critical step in the production process of AMLCDs. AMLCD is the FPD technology which best combines rapid response rate, low power consumption, wide viewing angle and long lifetime while providing contrast, resolution and color quality that generally rivals the best cathode ray tubes and surpasses passive matrix displays. AMLCDs are now used in high end laptop and notebook computers, camcorder viewfinders and miniature color televisions. The principle disadvantage of AMLCDs is the high production cost; this invention aims to remedy that problem.

An AMLCD screen can be a pile of planar substrates including: a light field polarizing element 36, a circuit substrate 37, a liquid crystal solution 38, color filters 39, and a second polarizing element 40. The circuit substrate is a complex electronic device comprised of high density microstructure of circuit lines and electronic components. The entire display can be made of millions of pixels each being similar or identical in structure to the others. Light from a source can be modulated by the device as the liquid crystal material can variably rotate the polarization state of the light propagating therethrough. The circuits of each pixel independently control the transmission of light through that pixel thereby creating a light pattern. Manufacturing the circuit substrate of an AMLCD requires the highly accurate printing onto a substrate of the high density microstructure which may be many layers in depth with their individual layers and interconnects. These layers are built up one-by-one on the substrate base. In the first layer, a material such as indium tin oxide, a transparent metal, is applied to the substrate base. Next, a coating of light-sensitive photoresist chemical is applied. A series of photomask images is then successively imaged onto the photoresist by a photolithographic system, using a lens array. Each pattern exposed onto the photoresist can then be developed and etched. Developing removes the exposed photoresist pattern, while unexposed photoresist remains on the substrate impressing the image of the photomask onto the substrate. Through a chemical process, etching then removes the metal layer in the exposed areas thereby transmitting the image into the metal layer thus creating the AMLCD circuitry and electronic structure. For the second layer, an insulating material, such as silicon nitride, is applied on top of the previous layer. Again, a coating of photoresist is added and the plate is exposed, developed and etched. These steps are typically repeated five to seven times, or as many times as there are layers required to realize the electronic devices such as transistors and the electronic circuitry required to support those devices. The invention provides an excellent means for the exposure of the photoresist and for cooperation of images of the various layers which make-up the device. Because the AMLCD has multiple exposures and each exposure is over a very large area, a lens array exposure tool with large area capability is a possible solution for the current limits face in the industry.

There are several ways to address the need for images that are continuous between cells or image fields 41 that are adjacent to each other. The required electronics to drive a single pixel, for example transistors, can be imaged as self contained circuits that are continuous within a field-of-view 42 of a single lens unit. In some circuit layer being applied after of before the portions of the self-contained circuits are formed, it can be the case that interconnections 43 between pixels may need to be formed. To achieve this, the exposures of the final layers are made with a displacement 44 of the lens array. Before the exposure, the lens array is displaced some fraction of a cell width such that the image field of a previous layer overlaps 45 the image fields of a sequential layer. In this step, some precision alignment means may be required but these systems are well known and with careful choices of interconnect geometries, the level of precision can be reduced in comparison to alignment systems of the art. It is no longer necessary to have alignment systems that are capable of alignment to a small fraction of an image feature.

Figure 8:
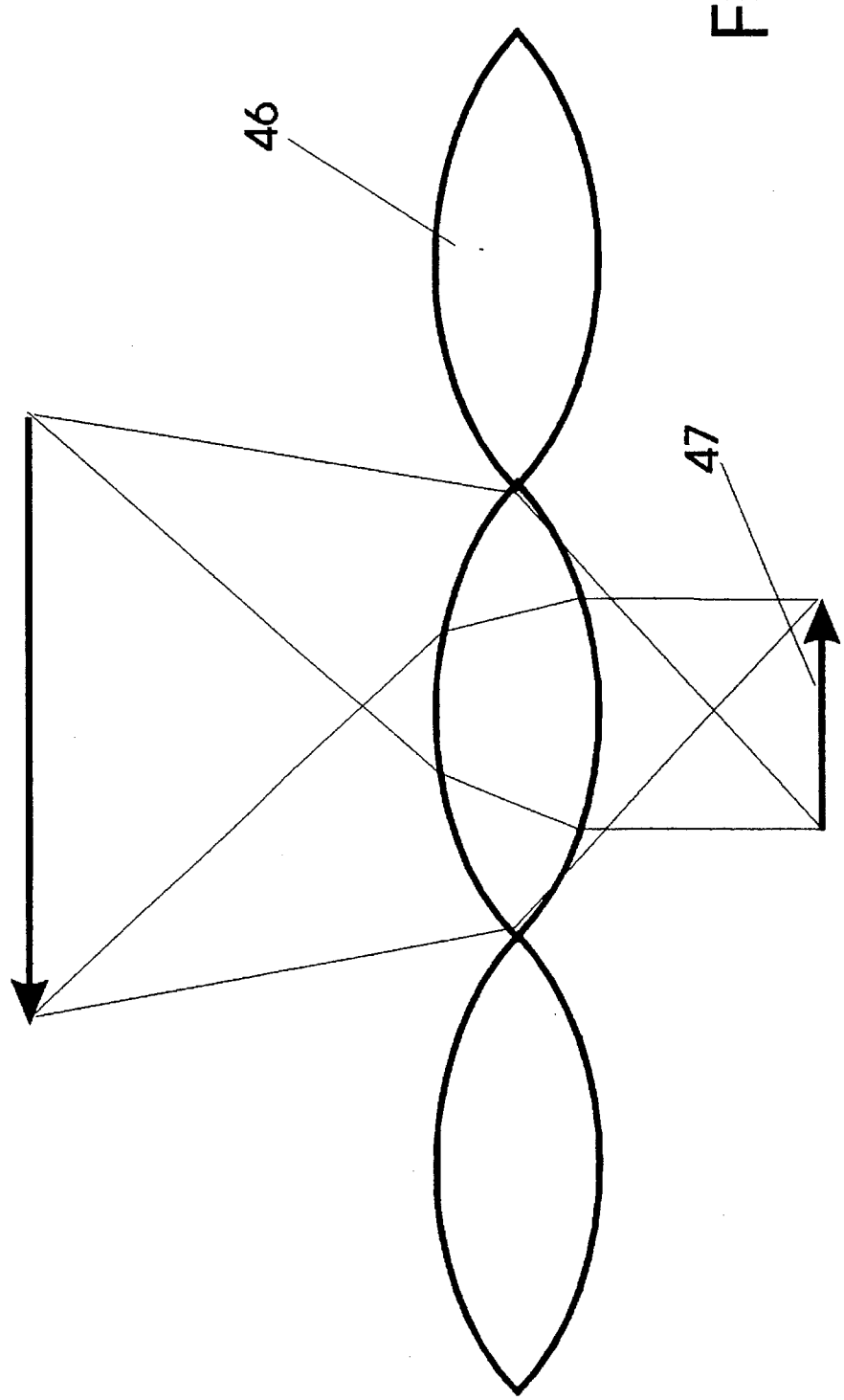
Figure 9B:
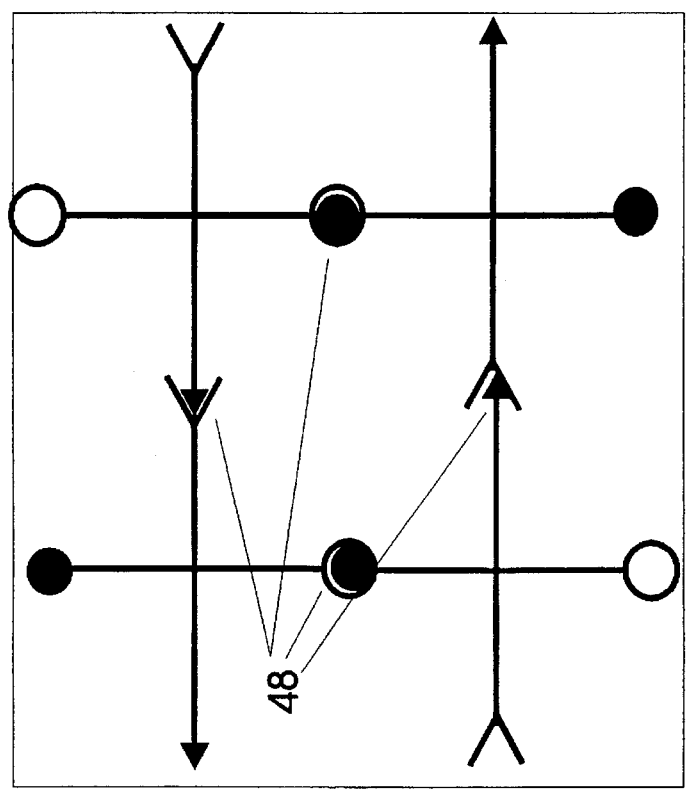
Figure 9A:
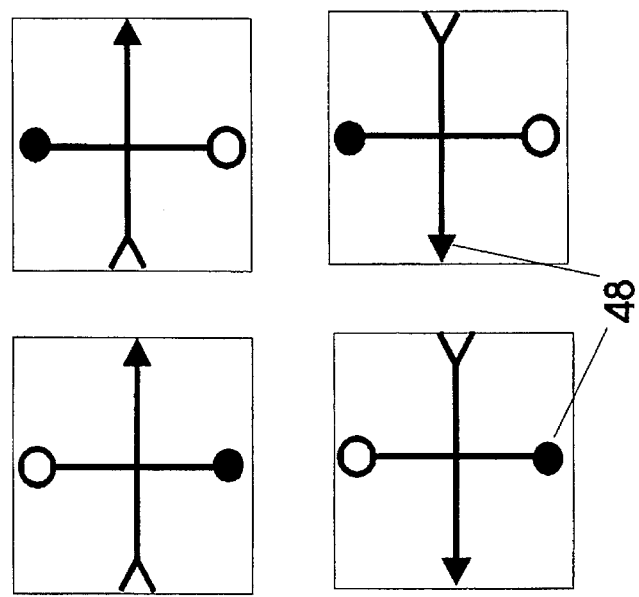
Figure 10B:
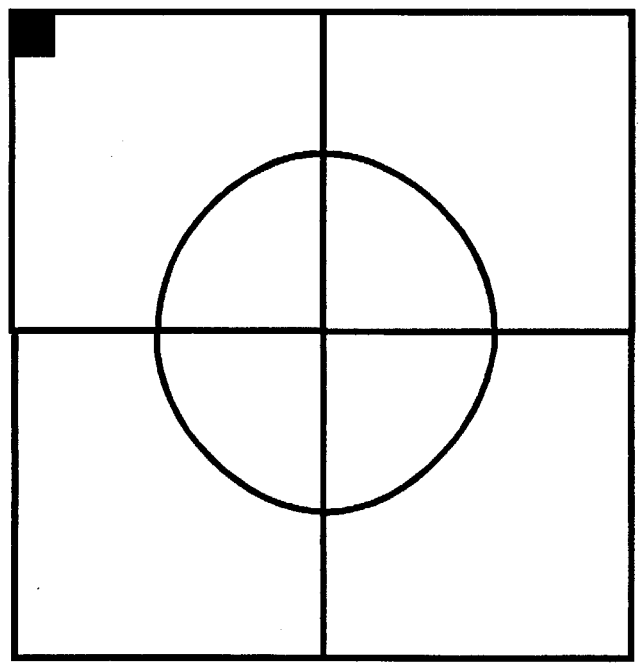
Figure 10A:
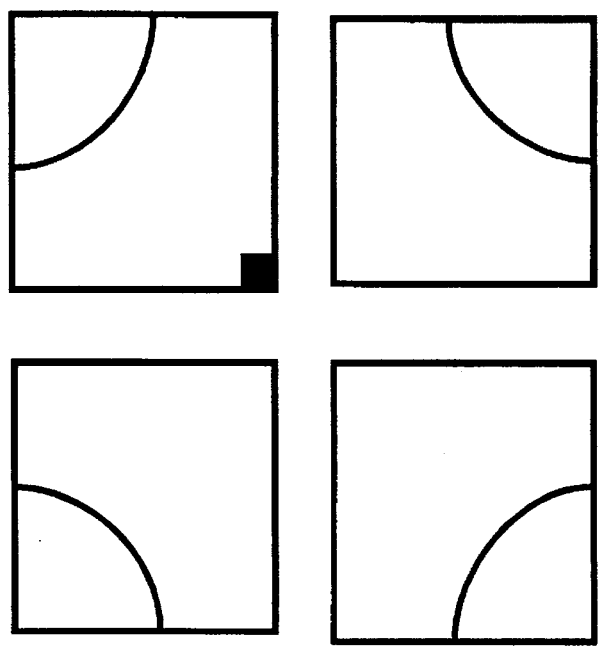
Figure 11A:
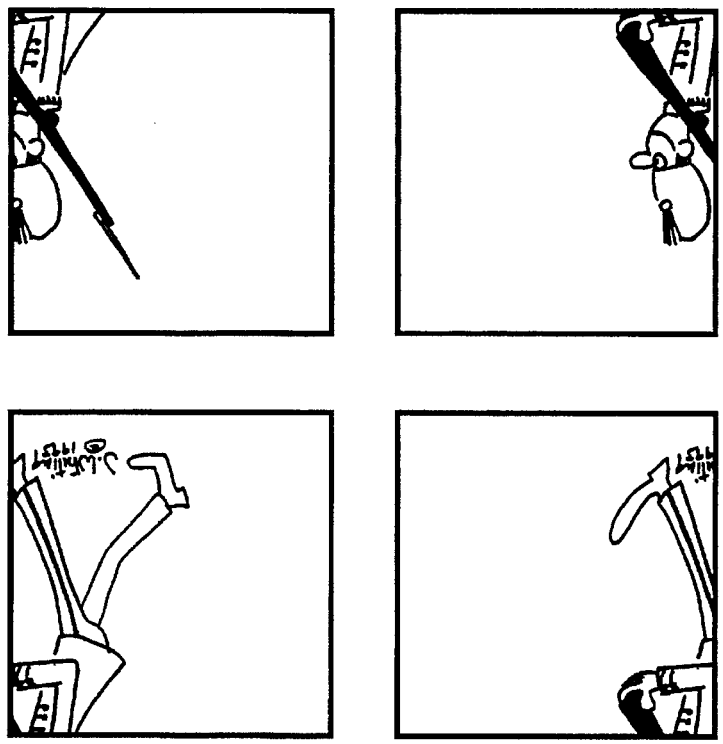
Figure 11B:
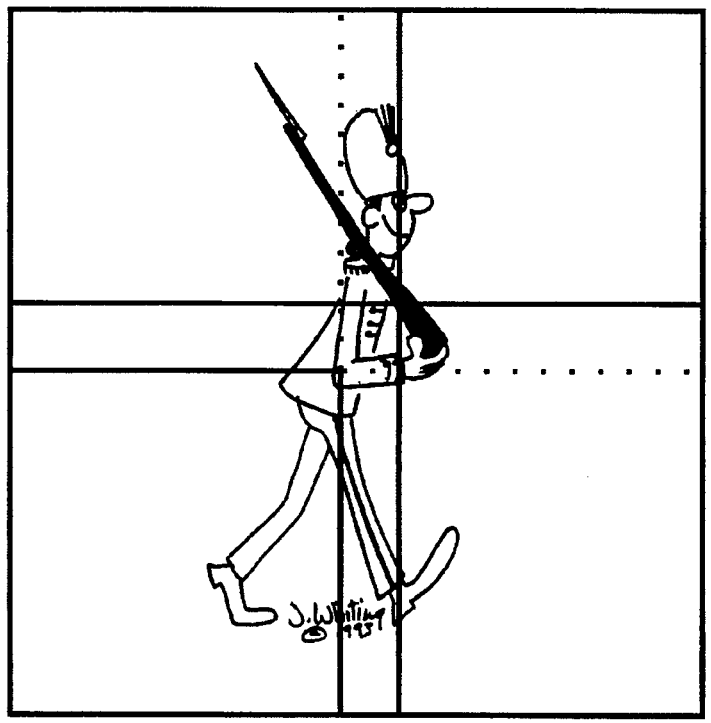
Figure 12:
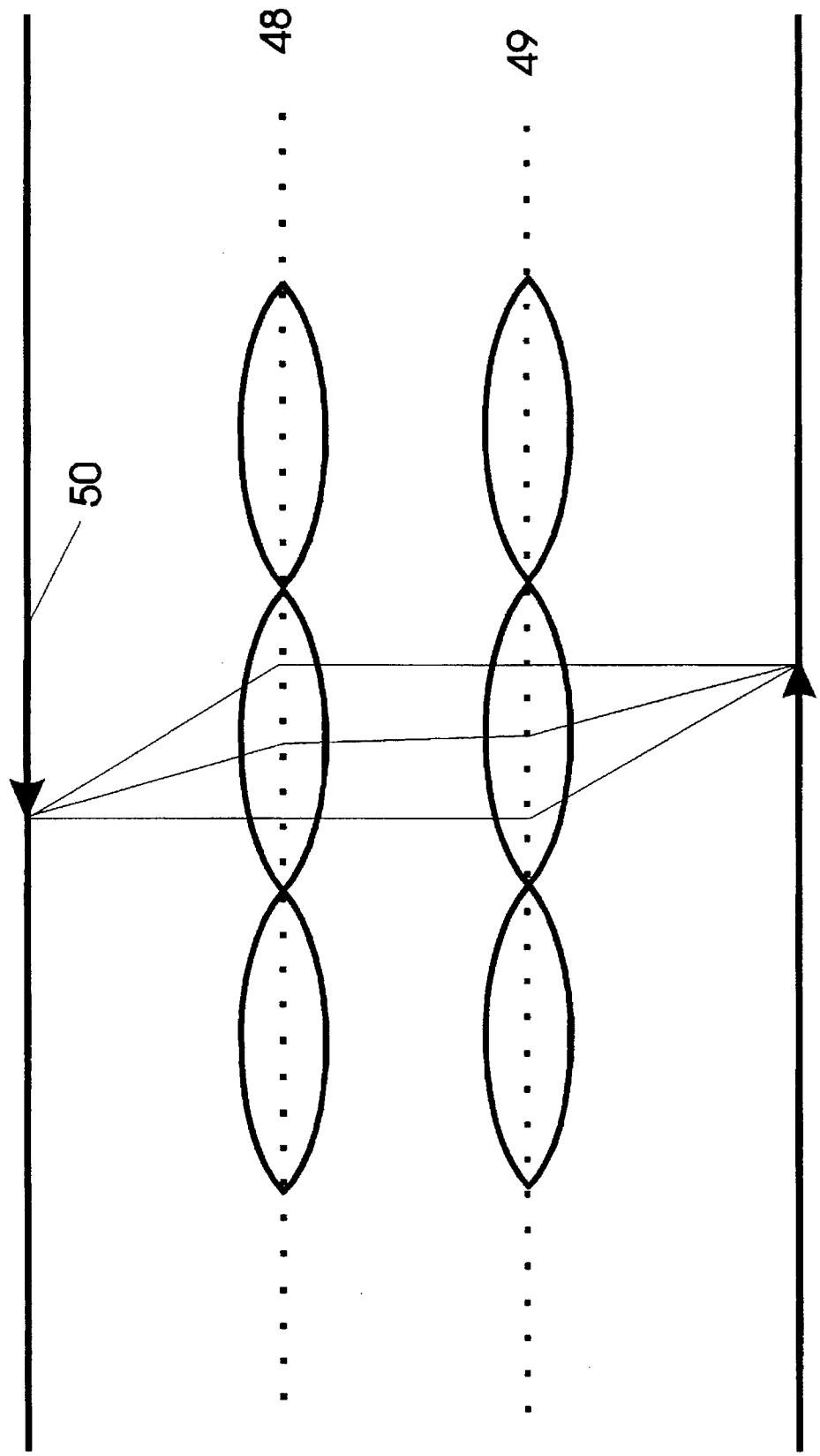
Figure 13A:
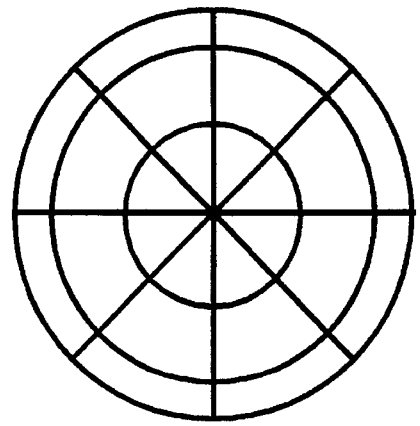
Figure 13B:
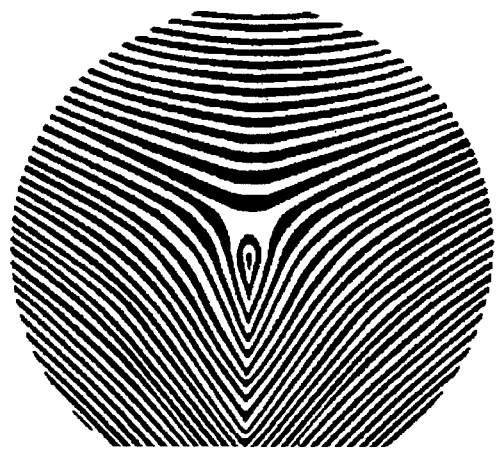
Figure 13C:
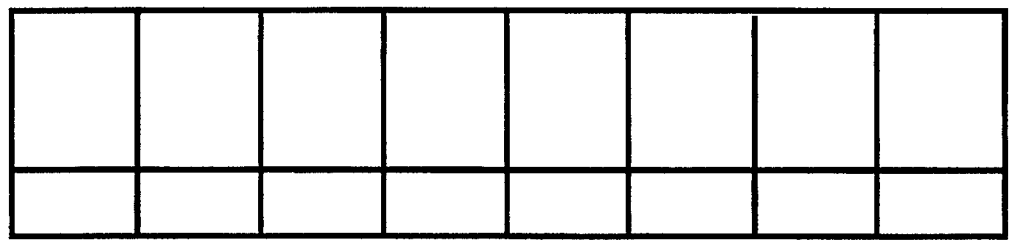

Although it may be possible to butt adjacent image fields together such that circuitry can be made continuous across more than one image field, there exists a potential for errors. This is particularly difficult in light of the vignetting that occurs at the edges of lens fields and other limits of one-to-one imaging. Instead of butting adjacent fields along a demarcation line, it is possible to overlap two fields in some common interconnect zone which is comprised of image information from both of two fields that are adjacent to each other. This is possible because the magnification properties of a lens array 46 act on each sub-field 47 of the image compared to the magnification properties of a single lens imager which acts on the entire image. In this way, image sub-fields with patterns therein can be made to overlap such that the patterns in one image sub-field are in good communication with the patterns of an adjacent image sub-field. An example of this geometry is shown in FIG. 8. The image shown in the FIGS. 9A and 9B is an exaggeration of an interconnect arrangement that could prevent even gross adjacent field image errors. It is further possible to have a very small overlap zone and intersecting geometries without special terminations 48 that are oversized as is shown in the drawing. It the limiting case, a mask could be carefully designed to have overlap regions but the final image 9B produced could be continuous over the entire area of the circuit substrate. A mask (FIG. 11A) that has been computer generated from the image of a cartoon soldier in consideration of magnification and image inversions occurring at each lens of an array, is shown alongside of the image (FIG. 11B) of the cartoon soldier which the mask is capable of producing in conjunction with a lens array device set up for magnification. Lens array magnification can be achieved the same way as simple lens magnification where the ratio of the distances between the photomask (object) and the circuit substrate (image) each with respect to the lens plane, defines the value of the magnification. An optical schematic is shown as FIG. 8 which is a lens array in a magnification orientation.

In an alternative preferred embodiment it may be useful to provide multiple lens arrays in series to provide a specific imaging objective. In a simple optical schematic of FIG. three, it would be obvious to a engineer that there is a possibility of one lens imaging a photomask field that is adjacent to the photomask field aligned with that lens. This "cross-talk" problem could cause multiple images superimposed together. For square arrays in the simple case, eight noise images would appear on each primary image do to the imaging of each lens adjacent to a primary lens imaging a mask pattern two image cells from a primary photomask cell in each of eight directions. Although careful attention to vignetting limits and photomask field sizes could be used to control this effect, it is also possible to use a "field-lens" array 48 to prevent the passing of these unwanted images. An array of field lenses can be placed between an imaging lens array 49 and the photomask 50 to collimate the light coming from the photomask. Light that does not enter the aperture of the correct field lens gets lost in the system instead of becoming imaged as can be possible without field lenses. Using a plurality of arrays located sequentially in space with respect to a light field passing therethrough is considered to be a subset of simpler embodiments of the invention. Another reason to combine several lens arrays in series is to correct for the effect of chromatic aberration; again, this is well know in the optics field and this effect translates nicely to the array photolithography systems. There are other possibilities of using multiple lenses in series to achieve imaging objectives and these are known from common geometrical optics. It is anticipated that the advantages of combining more than a single lens in this way will yield further advantages when applied to lens array photolithography.

A common problem experienced in the manufacture of large area devices is substrate shrinkage caused by processing environments between printing sucsessive layers. If a layer is first primed and then processed in etching and evaporating environments, the entire substrate can shrink. A following layer's image may not align well or be sized correctly with respect to the image of the first layer. Shrinkage is sometimes predicable and in that case the image can be compensated for in the construction of the photomask patterns. But shrinkage is not always exact and consistent and may vary from day-to-day. Some systems of the art respond by slight magnification changes. This only works in very limited ways as the shrinkage is not always axially sysmetric. It is possible to have a library of lens arrays that correspond to a single layer where each single array in that library corresponds to a condition where the substrate has suffered a particular known shrinkage characteristic. The library can be constructed to address even complicated shrinkage phenomena such as shrinkage in a single dimension which could not be addressed by lens imaging systems.

Each of the embodiments presented have had lens elements that were simple approximations of conventional optical lens or aspherics. In very sophisticated embodiments, it is possible to have non-axially symmetric lens arrays to provide advanced imaging objectives. Binary optical devices can be used to create a lens whose "optic axis" is not a simple line as is the axis of conventional optical devices, but rather a plane segment, a conic section or even a lens with an imaginary axis; imaginary in the mathamatical sense. With computer designs and the flexibility of binary optical implementations, a lens can be designed such that it also has an irregularly shaped image field or provides some complex mapping of an object field to an image field. Such translation is sometimes called conformal mapping in mathematics.

Because of circuitry requirements that may be particular to a specific device, there may be a need to realize an image field that is irregular in shape. The image field of conventional lenses is symmetric about the lens axis and is defined as a circle. Since circles are awkward in some geometries, circular image fields are frequently apertured to a square having corners defined by points on the circle. The image areas outside the bounds of the square but inside the circle represent areas of wasted space. In lens array systems, those areas of wasted space may interfere with images of adjacent lenses if the images are to be in close proximity. This is an artifact of axially symmetric optics and can be eliminated in BOD designs. BODs can be designed to have any shape image field. If some microdevice structure requires a group of squares next to a rectangle section next to it, these areas can be addressed with single BOD lenses. A rectangular field is impossible to achieve with conventional optics without aperturing, yet is quite simple with binary optical devices.

It may also be necessary for some devices to generate an image that is not possible to generate on the photomask. Photomasks are sometimes made with electron beam machines and they produce images with axially symetric artifacts. A photomask may easily generate a pattern free from erros that is radially symmetric but an image having non-radial symmetry would necessarily suffer from errors intrinsic in the electron beam writing process. Radially symetric image patterns flawlessly generated with an electron beam machine could then be converted into rectangularly symmetric images with a BOD that maps concentric circles to parallel lines. FIG. thirteen "A" shows a radial pattern that can be flawlessly generated by an electron gun photomask writing machine. FIG. thirteen "B" shows a BOD used to image the pattern of thirteen "A". FIG. thirteen "C" shows the resultant rectangularly symmetric pattern which could not be generated without some asymmetric error caused by the electron beam writing system and transferred to the circuit substrate through photolithography. With conformal mapping techniques it is possible to have many translations that result in otherwise impossible imaging patterns and therefore otherwise impossible devices. Image geometries that could not be realized in conventional optical systems can be easily generated with binary optical device imagers.

We claim:

1. An apparatus for photolithographic exposure which comprises a lens array, said lens array comprising a planar substrate member of rigid material being optically transparent and having thereon at least one surface, a matrix arrangement of a plurality of unit lens elements, said planar substrate further comprising edges which define a perimeter of a first surface and a second surface, wherein the surfaces are substantially parallel to each other;

said rigid material further comprising an optically transparent material which supports physical microstructure being operable as diffractive optical elements;

said matrix arrangement further comprising a two dimensional geometrically regular pattern defines the image sub-field demarcation boundaries and the array perimeter the apparatus field-of-view;

said lens elements further comprising a subsection of the array surface defined by the matrix arrangement and having an axis therein and substantially perpendicular to the array surface, said subsection perimeter defining the bounds of the microstructure of a single lens element.

2. A method of photolithographic exposure whereby a light field is passed through an array of optical elements to form at least one image, said photolithographic exposure is the step in photolithographic processes that chemically alters a photosensitive material on a circuit substrate by exposure to light usually in a predetermined pattern defined by a photomask;

said passing of a light field is: generating at a light source a geometrically regular light field, and propagating in a direction toward and through a photomask thereby creating a binary light field of high and low intensity areas which represent the spatial pattern of the photomask and is carried by the light field, the light field propagating further through a lens array;

said forming of an image comprised of the pattern of the photomask with areas of relative high intensity and areas of relative low intensity light, the high intensity areas being operable for changing the chemical composition of a light sensitive material and the low intensity areas operable for not appreciably changing the chemical composition of the light sensitive material thereby impressing the two dimensional pattern of the light field into the light sensitive material.

3. A method of photolithographic exposure whereby a light field is passed through an array of optical elements to form at least one image, said optical elements are binary optical devices.

4. An apparatus for printing patterns of microstructure to form a flat panel display device comprised of: a photomask; a lens array; and a receiver substrate, said photomask being comprised of an optical substrate having planar surfaces operable for receiving an opaque material thereon, the photomask being operable for spatially modulating a uniform light field being passed therethrough;

said lens array being a single plane matrix arrangement of lenses having axial symmetry;

said receiver substrate being a rigid substrate having a layer of light sensitive material operable for converting a light pattern into microstructure.

5. An apparatus of claim 4 comprised further of: a light source; a plurality of photomask images; a lens array plane; a plurality of unit lenses; an image plane; and a plurality of image fields, said light source being operable for producing a substantially uniform light field to illuminate a plurality of photomask images; the photomask further comprising said plurality of photomask images thereon, each photomask image comprising a portion of a pattern of microstructure;

said lens array plane being orthogonal to the direction of propagation of the uniform light field and parallel to the photomask, having a lens array therein;

said plurality of unit lenses each having axial symmetry, the axial direction being normal to the lens array plane and parallel to the direction of propagation of the uniform light field, being operable for imaging a photomask image into;

said image plane; comprised of said plurality of image fields.

6. An apparatus of claim 5, said image fields being inverted in relation to said photomask images.

7. An apparatus of claim 6, the distance between the photomask and the lens array plane is less that the distance between the lens array plane and the image plane to affect magnification as is provided in Gaussian imaging geometries.

8. An apparatus of claim 7 the edges of each image field are collinear with one edge of each adjacent image field.

9. An apparatus of claim 7, the photomask further comprises opaque regions between each of the photomask images.

10. An apparatus of claim 9, each of the image fields overlaps a portion of each image field adjacent thereto.

11. A method for photolithographic exposure comprising the steps:

a) illuminating a photomask with a spatially uniform beam of light to impress thereon a modulated intensity pattern;

b) passing the modulated beam through an imaging means;

c) placing a light sensitive medium in the image plane of the imaging means, where the imaging means is one array of lenses.

12. A method of claim 11 where the array of lenses lies within a single plane.

13. A method of claim 11 where only a single image inversion occurs between the photomask and light sensitive medium.

14. A method of claim 11, the photolithographic exposure being particularly characterized by printing a microstructure onto a substrate to form a flat panel display device having a plurality of pixels where a first layer is printed first and a second layer is printed thereafter said second layer being displaced with respect to said first layer such that image features of the first layer overlap image features of the second layer.

* * * * *